United States Patent
Gao et al.

(10) Patent No.: US 12,362,403 B2
(45) Date of Patent: Jul. 15, 2025

(54) ELECTRODE SEPARATOR WITH PIEZOELECTRIC LAYER FOR IN-STACK PRESSURE SENSING AND DENDRITE CLEANING

(71) Applicant: GM GLOBAL TECHNOLOGY OPERATIONS LLC, Detroit, MI (US)

(72) Inventors: Jing Gao, Rochester, MI (US); Zhe Li, Rochester, MI (US); Xingcheng Xiao, Troy, MI (US); Brian J. Koch, Berkley, MI (US); Michael A Lelli, Rochester, MI (US); Dave G. Rich, Sterling Heights, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 702 days.

(21) Appl. No.: 17/592,630

(22) Filed: Feb. 4, 2022

(65) Prior Publication Data
US 2023/0253637 A1    Aug. 10, 2023

(51) Int. Cl.
*H01M 10/48*    (2006.01)
*H01M 10/0525*    (2010.01)
(Continued)

(52) U.S. Cl.
CPC ....... *H01M 10/48* (2013.01); *H01M 10/0525* (2013.01); *H01M 50/293* (2021.01);
(Continued)

(58) Field of Classification Search
CPC .. H01M 10/48; H01M 50/293; H01M 50/491; H01M 50/457; H01M 10/0525;
(Continued)

(56) References Cited

U.S. PATENT DOCUMENTS 6,275,004 B1    8/2001    Tamai et al.
7,507,498 B2 *  3/2009    Yoon ................ H01M 10/482
                                                        429/61
(Continued)

FOREIGN PATENT DOCUMENTS

WO    WO-2020170962 A1 *    8/2020

OTHER PUBLICATIONS

Ichiwah, Komeda translation (Year: 2020).*

*Primary Examiner* — Barbara L Gilliam
*Assistant Examiner* — Lawrence La Raia, III
(74) *Attorney, Agent, or Firm* — Quinn IP Law

(57) ABSTRACT

Presented are electrochemical devices with in-stack pressure sensors, methods for making/using such devices, and battery cells with electrode stacks having an electrode separator assembly with a piezoelectric layer for in-stack pressure sensing and dendrite cleaning. An electrochemical device, such as a lithium-class secondary battery cell for example, includes a device housing with an ion-conducting electrolyte located inside the device housing. A stack of working electrodes is also located inside the device housing, in electrochemical contact with the electrolyte. At least one electrode separator assembly is located inside the device housing, interposed between a neighboring pair of the working electrodes. The electrode separator assembly includes a pair of separator layers that transmit therethrough the ions of the electrolyte, and a piezoelectric layer that is interposed between the two separator layers. The piezoelectric layer outputs an electrical signal in response to deformation of one or both of the neighboring working electrodes.

18 Claims, 4 Drawing Sheets

(51) Int. Cl.
  *H01M 50/293* (2021.01)
  *H01M 50/457* (2021.01)
  *H01M 50/491* (2021.01)
  *H10N 30/30* (2023.01)
  *H10N 30/853* (2023.01)
  *H10N 30/857* (2023.01)
  *H10N 30/87* (2023.01)

(52) U.S. Cl.
  CPC ....... *H01M 50/457* (2021.01); *H01M 50/491* (2021.01); *H10N 30/302* (2023.02); *H10N 30/853* (2023.02); *H10N 30/857* (2023.02); *H10N 30/875* (2023.02); *H01M 2220/20* (2013.01); *Y02E 60/10* (2013.01)

(58) Field of Classification Search
  CPC ............ H01M 2220/20; H10N 30/302; H10N 30/853; H10N 30/875; H10N 30/857; Y02E 60/10
  See application file for complete search history.

(56) References Cited

U.S. PATENT DOCUMENTS

| | | | |
|---|---|---|---|
| 7,851,085 B2 | 12/2010 | Obrovac et al. | |
| 8,565,949 B2 | 10/2013 | Christman et al. | |
| 8,586,222 B2 | 11/2013 | Timmons et al. | |
| 9,028,565 B2 | 5/2015 | Huang | |
| 9,142,830 B2 | 9/2015 | Xiao et al. | |
| 9,142,980 B2 | 9/2015 | Lee | |
| 9,281,514 B2 | 3/2016 | Rhodes et al. | |
| 9,379,418 B2 | 6/2016 | Wang et al. | |
| 9,660,462 B2 | 5/2017 | Jeon | |
| 9,923,189 B2 | 3/2018 | Xiao | |
| 10,062,898 B2 | 8/2018 | Xiao | |
| 10,199,643 B2 | 2/2019 | Zhou et al. | |
| 10,367,201 B2 | 7/2019 | Yang et al. | |
| 10,388,959 B2 | 8/2019 | Dong et al. | |
| 10,424,784 B2 | 9/2019 | Yang et al. | |
| 10,435,773 B2 | 10/2019 | Liu et al. | |
| 10,446,884 B2 | 10/2019 | Yang et al. | |
| 10,511,049 B2 | 12/2019 | Yang et al. | |
| 10,566,652 B2 | 2/2020 | Dai et al. | |
| 10,573,879 B2 | 2/2020 | Yang et al. | |
| 10,593,988 B2 | 3/2020 | Xiao et al. | |
| 10,629,941 B2 | 4/2020 | Dai et al. | |
| 10,637,048 B2 | 4/2020 | Qi et al. | |
| 10,673,046 B2 | 6/2020 | Dadheech et al. | |
| 11,133,455 B2* | 9/2021 | Spann | H02N 1/006 |
| 2003/0151868 A1 | 8/2003 | Inae et al. | |
| 2011/0215767 A1 | 9/2011 | Johnson et al. | |
| 2011/0248675 A1 | 10/2011 | Shiu et al. | |
| 2012/0206296 A1 | 8/2012 | Wan | |
| 2013/0119935 A1 | 5/2013 | Sufrin-Disler et al. | |
| 2014/0152232 A1 | 6/2014 | Johnson et al. | |
| 2019/0280333 A1 | 9/2019 | Dahn et al. | |
| 2019/0280334 A1 | 9/2019 | Dahn et al. | |
| 2019/0393546 A1 | 12/2019 | Dahn et al. | |
| 2021/0091369 A1 | 3/2021 | Dadheech et al. | |
| 2021/0091424 A1 | 3/2021 | Gao et al. | |
| 2021/0218006 A1 | 7/2021 | Gao et al. | |
| 2023/0086348 A1* | 3/2023 | Lu | H01M 10/0525 429/144 |

* cited by examiner

ELECTRODE SEPARATOR WITH PIEZOELECTRIC LAYER FOR IN-STACK PRESSURE SENSING AND DENDRITE CLEANING

INTRODUCTION

The present disclosure relates generally to electrochemical devices. More specifically, aspects of this disclosure relate to stacked electrode assemblies with in-stack pressure sensors for lithium-class battery cells.

Current production motor vehicles, such as the modern-day automobile, are originally equipped with a powertrain that operates to propel the vehicle and power the vehicle's onboard electronics. In automotive applications, for example, the vehicle powertrain is generally typified by a prime mover that delivers driving torque through an automatic or manually shifted power transmission to the vehicle's final drive system (e.g., differential, axle shafts, corner modules, road wheels, etc.). Automobiles have historically been powered by a reciprocating-piston type internal combustion engine (ICE) assembly due to its ready availability and relatively inexpensive cost, light weight, and overall efficiency. Such engines include compression-ignited (CI) diesel engines, spark-ignited (SI) gasoline engines, two, four, and six-stroke architectures, and rotary engines, as some non-limiting examples. Hybrid-electric and full-electric vehicles (collectively "electric-drive vehicles"), on the other hand, utilize alternative power sources to propel the vehicle and, thus, minimize or eliminate reliance on a fossil-fuel based engine for tractive power.

A full-electric vehicle (FEV)—colloquially labeled an "electric car"—is a type of electric-drive vehicle configuration that altogether omits an internal combustion engine and attendant peripheral components from the powertrain system, relying instead on a rechargeable energy storage system (RESS) and a traction motor for vehicle propulsion. The engine assembly, fuel supply system, and exhaust system of an ICE-based vehicle are replaced with a single or multiple traction motors, a traction battery pack, and battery cooling and charging hardware in a battery-based FEV. Hybrid-electric vehicle (HEV) powertrains, in contrast, employ multiple sources of tractive power to propel the vehicle, most commonly operating an internal combustion engine assembly in conjunction with a battery-powered or fuel-cell-powered traction motor. Since hybrid-type, electric-drive vehicles are able to derive their power from sources other than the engine, HEV engines may be turned off, in whole or in part, while the vehicle is propelled by the electric motor(s).

Many commercially available hybrid-electric and full-electric vehicles employ a rechargeable traction battery pack to store and supply the requisite power for operating the powertrain's traction motor unit(s). In order to generate tractive power with sufficient vehicle range and speed, a traction battery pack is significantly larger, more powerful, and higher in capacity (Amp-hr) than a standard 12-volt starting, lighting, and ignition (SLI) battery. Contemporary traction battery packs, for example, group stacks of battery cells (e.g., 8-16+ cells/stack) into individual battery modules (e.g., 10-40+ modules/pack) that are mounted onto the vehicle chassis by a battery pack housing or support tray. Stacked electrochemical battery cells may be connected in series or parallel through use of an electrical interconnect board (ICB) or front-end DC bus bar assembly. A dedicated Electronic Battery Control Module (EBCM), through collaborative operation with a Powertrain Control Module (PCM) and Traction Power Inverter Module (TPIM), regulates the opening and closing of battery pack contactors to govern operation of the battery pack.

There are four primary types of batteries that are used in electric-drive vehicles: lithium-class batteries, nickel-metal hydride batteries, ultracapacitor batteries, and lead-acid batteries. As per lithium-class designs, lithium-metal (primary) batteries and lithium-ion (secondary) batteries make up the bulk of commercial lithium battery (LiB) configurations, with lithium-ion (Li-ion) variants being employed in automotive applications due to their enhanced stability, energy density, and rechargeable capabilities. A standard Li-ion cell is generally composed to at least two conductive electrodes, an electrolyte material, and a permeable separator, all of which are enclosed inside an electrically insulated packaging. One electrode serves as a positive ("cathode") electrode and the other electrode serves as a negative ("anode") electrode during cell discharge. Rechargeable Li-ion batteries operate by reversibly passing lithium ions back and forth between these working electrodes. The separator—oftentimes a microporous polymeric membrane—is disposed between the two electrodes to prevent electrical short circuits while also allowing the transport of ionic charge carriers. The electrolyte is suitable for conducting lithium ions and may be in solid form (e.g., solid state diffusion), liquid form (e.g., liquid phase diffusion), or quasi-solid form (e.g., solid electrolyte entrained within a liquid carrier). Ions move from the negative electrode, through a connected circuit, to the positive electrode during discharge of the battery while under load, and in the opposite direction when recharging the battery.

SUMMARY

Presented herein are electrochemical devices with in-stack pressure sensors, methods for manufacturing and methods for operating such electrochemical devices, and lithium-class battery cells with stacked working electrodes having an electrode separator assembly with a piezoelectric layer for in-stack pressure sensing and dendrite cleaning. By way of example, a pouch-type lithium-ion battery cell contains an electrode stack with a succession of anode electrodes interleaved with a corresponding number of cathode electrodes. An electrically insulating and ionically conductive separator, which may be in the nature of a polymeric separator sheet immersed in liquid electrolyte or bonded to solid electrolyte, is disposed between each pair of neighboring electrodes. One or more of these electrode pairs incorporate a functional separator assembly with two polymeric separator sheets that sandwich therebetween a piezoelectric layer with adjoining conductive layers. Like the separator sheets, the piezoelectric layer is sufficiently porous to allow for the transfer therethrough of Li ions. Expansion or bowing of the electrodes causes deformation of the piezoelectric (piezo) layer; this, in turn, causes the release of an electrical charge from the shifting crystalline structure within the piezo material. The resultant voltage may be monitored and regressed to deformation using a calibrated correlation between the piezo material's voltage and deformation to derive a real-time, in-stack pressure. Conversely, a modulated voltage may be passed through the piezo layer to generate a localized harmonic vibration of sufficient amplitude/frequency to break dendrite growth off of the electrodes.

Attendant benefits for at least some of the disclosed concepts include battery electrode stacks with piezoelectric functional layers that enable in-stack pressure sensing by converting stack deformation to a measurable electrical signal that exhibits a calibrated linear relationship between voltage and deformation. Other attendant benefits include the ability to selectively impart an alternating current/voltage signal to the piezoelectric functional layer in order to apply an in situ localized mechanical vibration adequate to break dendrite formation from the stack. By eliminating the need for externally mounted pressure sensing devices with dedicated packaging space, disclosed concepts help to simplify battery pack design while reducing pack size, part costs, and manufacturing time. In addition to improved electrode monitoring and battery operation, disclosed concepts may help to increase driving range, fuel economy, and pack performance for electric-drive vehicles.

Aspects of this disclosure are directed to electrochemical devices, such as cylindrical, pouch, and prismatic LiB cells that are used, for instance, in the battery modules of vehicular traction battery packs. In an example, an electrochemical device is constructed with a protective device housing for storing therein an electrolyte composition that is chemically configured to conduct ions. An electrode stack, which is located inside the device housing in electrochemical contact with the electrolyte, includes one or more first (e.g., anode) working electrodes interleaved with one or more second (e.g., cathode) working electrodes. One or more electrode separator assemblies are also located inside the device housing; each electrode separator assembly is interposed between and physically separates a neighboring pair of the working electrodes. The electrode separator assembly is generally composed of two electrically insulating separator layers and a piezoelectric layer interposed between the separator layers. The separator layers and piezoelectric layer all transmit therethrough the ions of the electrolyte. The piezoelectric layer, when deformed, responsively outputs one or more electrical output signals; the piezoelectric layer also deforms in response to receipt of one or more electrical activation signals.

Additional aspects of this disclosure are directed to lithium-class battery cells with stacked electrode assemblies having in-stack pressure sensors, rechargeable battery packs employing such lithium-class battery cells, and motor vehicles equipped with such battery packs. As used herein, the terms "vehicle" and "motor vehicle" may be used interchangeably and synonymously to include any relevant vehicle platform, such as passenger vehicles (ICE, HEV, FEV, fuel cell, fully and partially autonomous, etc.), commercial vehicles, industrial vehicles, tracked vehicles, off-road and all-terrain vehicles (ATV), motorcycles, farm equipment, e-bikes, watercraft, aircraft, etc. For non-automotive applications, disclosed concepts may be implemented for any logically relevant use, including stand-alone power stations and portable power packs, photovoltaic systems, handheld electronic devices, pumping equipment, machine tools, appliances, etc. While not per se limited, disclosed concepts may be particularly advantageous for use in lithium-metal cylindrical, pouch, and prismatic can cells.

In an example, a motor vehicle includes a vehicle body with a passenger compartment, multiple drive wheels rotatably mounted to the vehicle body (e.g., via corner modules coupled to a unibody or body-on-frame chassis), and other standard original equipment. For electric-drive vehicle applications, one or more electric traction motors operate alone (e.g., for FEV powertrains) or in conjunction with an internal combustion engine assembly (e.g., for HEV powertrains) to selectively drive one or more of the road wheels to propel the vehicle. A rechargeable traction battery pack is mounted onto the vehicle body and operable to power the traction motor(s).

Continuing with the discussion of the preceding example, the traction battery pack contains multiple lithium-class battery cells, e.g., stacked within one or more battery modules. Each battery cell is fabricated with a protective battery housing that stores therein a liquid, solid, or quasi-solid electrolyte composition for conducting ions. An electrode stack is located inside the battery housing in electrochemical contact with the electrolyte. The electrode stack includes a series of first (anode) working electrodes that is interleaved with a corresponding number of second (cathode) working electrodes. Also located inside the battery housing is an electrode separator assembly that is interposed between a respective pair of the working electrodes. The electrode separator assembly includes a pair of electrically insulating, ion transmitting separator layers with an electro-mechanically deformable piezoelectric layer interposed between the separator layers. When deformed, e.g., via deformation of the surrounding working electrodes, the piezoelectric layer responsively outputs an electrical output signal. Conversely, this piezoelectric layer changes shape/size responsive to receipt of an electrical activation signal.

Aspects of this disclosure are also directed to manufacturing processes, control logic, and computer-readable media (CRM) for making and/or using any of the disclosed electrochemical devices, battery packs, and/or vehicles. In an example, a method is presented for assembling an electrochemical device. This representative method includes, in any order and in any combination with any of the above and below disclosed options and features: receiving a device housing of the electrochemical device; locating an electrolyte inside the device housing, the electrolyte being configured to conduct ions; locating an electrode stack inside the device housing in electrochemical contact with the electrolyte, the electrode stack including first and second working electrodes; locating an electrode separator assembly inside the device housing and between the first and second working electrodes, the electrode separator assembly including: first and second separator layers formed with an electrically insulating material and configured to transmit therethrough the ions of the electrolyte; and a piezoelectric layer interposed between the first and second separator layers, the piezoelectric layer configured to output an electrical output signal in response to deformation of the piezoelectric layer and to deform in response to receipt of an electrical activation signal.

For any of the disclosed vehicles, methods, and devices, the piezoelectric and separator layers are sufficiently porous so as to enable the transmission therethrough of electrolyte ions. In this regard, a (first) porosity of the separator layers may be the same as or different from a (second) porosity of the piezoelectric layer. As yet a further option, the porosities of the separator layers and the piezoelectric layer may have a void fraction (i.e., void volume to total volume) of about 30% to about 80%.

For any of the disclosed vehicles, methods, and devices, the separator layers may have a thickness of about 5 micrometers (μm) to about 30 μm. As yet a further option, the separator layers may be formed, in whole or in part, from a polyolefin material, such as polypropylene, polyethylene, polytetrafluoroethylene, polytriphenylamine polyvinylidene fluoride, cellulose composite, or any combination thereof. In a similar regard, the piezoelectric layer may have a thickness of about 0.5 μm to about 10 μm. As yet a further option, the piezoelectric layer may be formed, in whole or in part, from lead zirconium titanate (PZT), zinc oxide (ZnO), polyvinylidene difluoride (PVDF), as well as piezoelectric ceramics, polymers, and composites.

For any of the disclosed vehicles, methods, and devices, the electrode separator assembly may also include a pair of conductive layers that sandwich therebetween the piezoelectric layer and conduct electricity to and from the piezoelectric layer. In this instance, each of the conductive layers has a thickness of about 10 nanometers (nm) to about 500 nm and is formed, in whole or in part, from copper, aluminum, silver, nickel, graphene, and/or gold. In some configurations, each electrode separator assembly consists essentially of the two electrically insulating separator layers, the two conductive layers, and the central piezoelectric layer. Optionally, the first separator layer is sandwiched between and abuts the first working electrode and the first conductive layer, the second separator layer is sandwiched between and abuts the second working electrode and the second conductive layer, and the piezoelectric layer abuts both the first and second conductive layers.

For any of the disclosed vehicles, methods, and devices, an electronic controller is operatively connected to the electrode separator assembly of the electrochemical device. This electronic controller may be programmed to: receive, from the piezoelectric layer, an electrical output signal that is generated in response to deformation of one or more of the working electrodes; determine a signal voltage of this electrical output signal; and determine a stack pressure of the electrode stack by regressing the signal voltage using a calibrated correlation between voltage and deformation of the piezoelectric layer. Optionally, the electronic controller may be programmed to transmit an electrical activation signal to the electrode separator assembly that causes the piezoelectric layer to generate a mechanical vibration with a predetermined amplitude and/or frequency sufficient to break/remove dendrite formation from one or more of the working electrodes.

The Summary is not intended to represent every embodiment or every aspect of the present disclosure. Rather, the foregoing summary merely provides an exemplification of some of the novel concepts and features set forth herein. The above features and advantages, and other features and attendant advantages of this disclosure, will be readily apparent from the following detailed description of illustrated examples and representative modes for carrying out the present disclosure when taken in connection with the accompanying drawings and the appended claims. Moreover, this disclosure expressly includes any and all combinations and subcombinations of the elements and features presented above and below.

Figure 1:
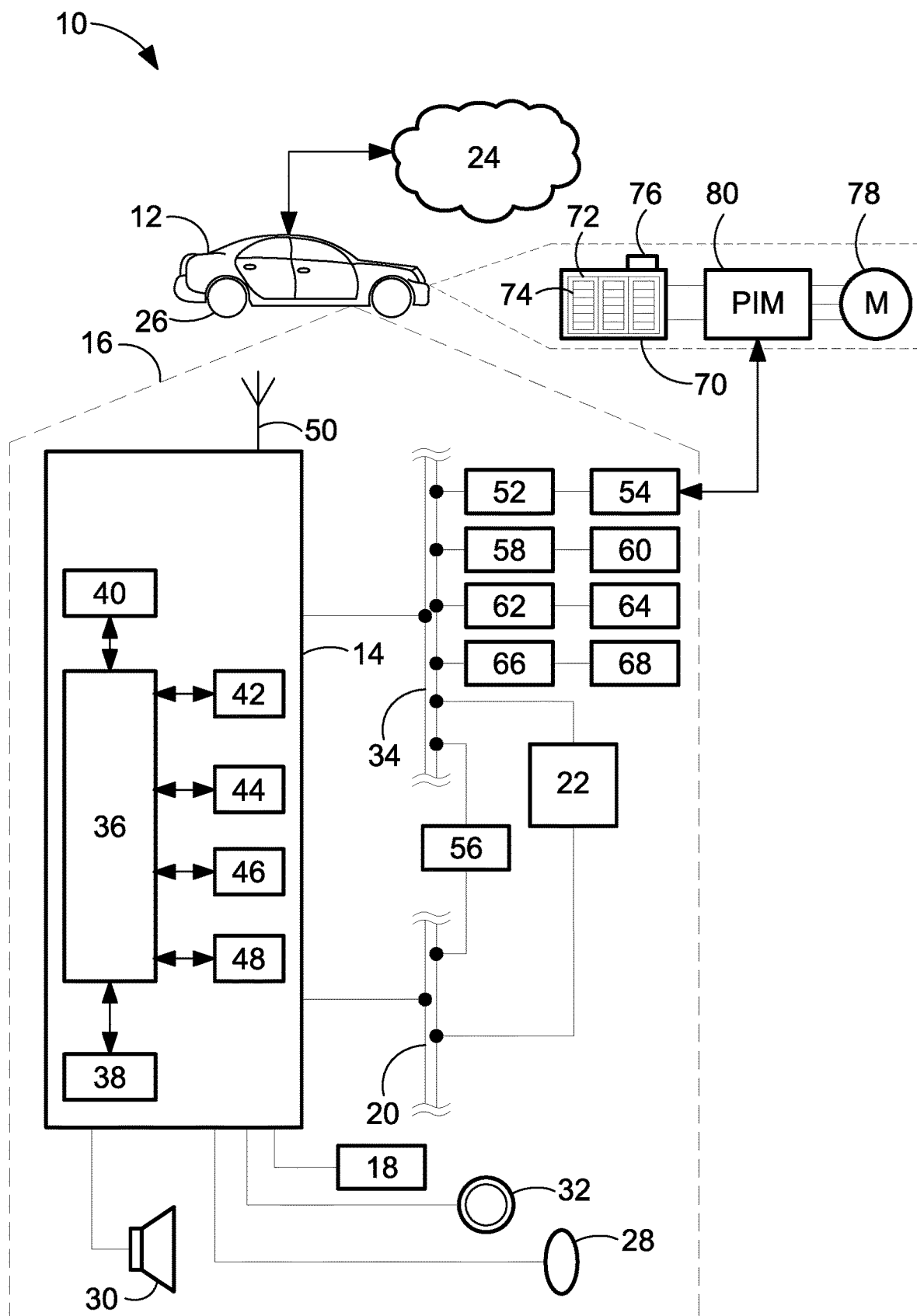
FIG. 1 is a partially schematic, side-view illustration of a representative motor vehicle with an electrified powertrain, a traction battery pack, and a network of in-vehicle controllers, sensing devices, and communication devices for in-stack battery cell pressure sensing and dendrite cleaning according to aspects of the disclosed concepts.

The present disclosure is amenable to various modifications and alternative forms, and some representative embodiments are shown by way of example in the drawings and will be described in detail herein. It should be understood, however, that the novel aspects of this disclosure are not limited to the particular forms illustrated in the above-enumerated drawings. Rather, the disclosure is to cover all modifications, equivalents, combinations, subcombinations, permutations, groupings, and alternatives falling within the scope of this disclosure as encompassed, for example, by the appended claims.

DETAILED DESCRIPTION

This disclosure is susceptible of embodiment in many different forms. Representative embodiments of the disclosure are shown in the drawings and will herein be described in detail with the understanding that these embodiments are provided as an exemplification of the disclosed principles, not limitations of the broad aspects of the disclosure. To that extent, elements and limitations that are described, for example, in the Abstract, Introduction, Summary, and Detailed Description sections, but not explicitly set forth in the claims, should not be incorporated into the claims, singly or collectively, by implication, inference or otherwise.

For purposes of the present detailed description, unless specifically disclaimed: the singular includes the plural and vice versa; the words "and" and "or" shall be both conjunctive and disjunctive; the words "any" and "all" shall both mean "any and all"; and the words "including," "containing," "comprising," "having," and the like, shall each mean "including without limitation." Moreover, words of approximation, such as "about," "almost," "substantially," "generally," "approximately," and the like, may each be used herein in the sense of "at, near, or nearly at," or "within 0-5% of," or "within acceptable manufacturing tolerances," or any logical combination thereof, for example. Lastly, directional adjectives and adverbs, such as fore, aft, inboard, outboard, starboard, port, vertical, horizontal, upward, downward, front, back, left, right, etc., may be with respect to a motor vehicle, such as a forward driving direction of a motor vehicle when the vehicle is operatively oriented on a horizontal driving surface.

Referring now to the drawings, wherein like reference numbers refer to like features throughout the several views, there is shown in FIG. 1 a representative automobile, which is designated generally at 10 and portrayed herein for purposes of discussion as a sedan-style, electric-drive passenger vehicle. The illustrated automobile 10—also referred to herein as "motor vehicle" or "vehicle" for short—is merely an exemplary application with which novel aspects of this disclosure may be practiced. In the same vein, incorporation of the present concepts into an FEV powertrain should be appreciated as a non-limiting implementation of disclosed features. As such, it will be understood that aspects and features of this disclosure may be applied to other powertrain architectures, incorporated into any logically relevant type of motor vehicle, and utilized for both automotive and non-automotive applications alike. Moreover, only select components of the motor vehicles and electrochemical devices are shown and described in additional detail herein. Nevertheless, the vehicles and devices discussed below may include numerous additional and alternative features, and other available peripheral components, for carrying out the various methods and functions of this disclosure.

The representative vehicle 10 of FIG. 1 is originally equipped with a vehicle telecommunication and information ("telematics") unit 14 that wirelessly communicates, e.g., via cell towers, base stations, mobile switching centers, satellite service, etc., with a remotely located or "off-board" cloud computing host service 24 (e.g., ONSTAR®). Some of the other vehicle hardware components 16 shown generally in FIG. 1 include, as non-limiting examples, an electronic video display device 18, a microphone 28, audio speakers 30, and assorted user input controls 32 (e.g., buttons, knobs, pedals, switches, touchpads, joysticks, touchscreens, etc.). These hardware components 16 function, in part, as a human/machine interface (HMI) that enables a user to communicate with the telematics unit 14 and other components resident to and remote from the vehicle 10. Microphone 28 provides a vehicle occupant with means to input verbal or other auditory commands; the vehicle 10 may be equipped with an embedded voice-processing unit utilizing audio filtering, editing, and analysis modules. Conversely, the speakers 30 provide audible output to a vehicle occupant and may be either a stand-alone speaker dedicated for use with the telematics unit 14 or may be part of an audio system 22. The audio system 22 is operatively connected to a network connection interface 34 and an audio bus 20 to receive analog information, rendering it as sound, via one or more speaker components.

Communicatively coupled to the telematics unit 14 is a network connection interface 34, suitable examples of which include twisted pair/fiber optic Ethernet switches, parallel/serial communications buses, local area network (LAN) interfaces, controller area network (CAN) interfaces, and the like. Other appropriate communication interfaces may include those that conform with ISO, SAE, and/or IEEE standards and specifications. The network connection interface 34 enables the vehicle hardware 16 to send and receive signals with one another and with various systems and subsystems both onboard the vehicle body 12 and off-board the vehicle body 12. This allows the vehicle 10 to perform assorted vehicle functions, such as modulating powertrain output, governing operation of the vehicle's transmission, activating the friction and regenerative brake systems, controlling vehicle steering, regulating charge and discharge of the vehicle's battery pack(s), and other automated functions. For instance, telematics unit 14 receives and transmits signals and data to/from a Powertrain Control Module (PCM) 52, an Advanced Driver Assistance System (ADAS) module 54, an Electronic Battery Control Module (EBCM) 56, a Steering Control Module (SCM) 58, a Brake System Control Module (BSCM) 60, and assorted other vehicle ECUs, such as a transmission control module (TCM), engine control module (ECM), Sensor System Interface Module (SSIM), etc.

With continuing reference to FIG. 1, telematics unit 14 is an onboard computing device that provides a mixture of services, both individually and through its communication with other networked devices. This telematics unit 14 is generally composed of one or more processors 40, each of which may be embodied as a discrete microprocessor, an application specific integrated circuit (ASIC), or a dedicated control module. Vehicle 10 may offer centralized vehicle control via a central processing unit (CPU) 36 that is operatively coupled to a real-time clock (RTC) 42 and one or more electronic memory devices 38, each of which may take on the form of a CD-ROM, magnetic disk, IC device, flash memory, semiconductor memory (e.g., various types of RAM or ROM), etc.

Long-range vehicle communication capabilities with remote, off-board devices may be provided via one or more or all of a cellular chipset/component, a navigation and location chipset/component (e.g., global positioning system (GPS) transceiver), or a wireless modem, all of which are collectively represented at 44. Close-range wireless connectivity may be provided via a short-range wireless communication device 46 (e.g., a BLUETOOTH® unit or near field communications (NFC) transceiver), a dedicated short-range communications (DSRC) component 48, and/or a dual antenna 50. It should be understood that the vehicle 10 may be implemented without one or more of the above listed components or, optionally, may include additional components and functionality as desired for a particular end use. The communications devices described above may provision data exchanges as part of a periodic broadcast in a vehicle-to-vehicle (V2V) communication system or a vehicle-to-everything (V2X) communication system, e.g., Vehicle-to-Infrastructure (V2I), Vehicle-to-Pedestrian (V2P), Vehicle-to-Device (V2D), etc.

CPU 36 receives sensor data from one or more sensing devices that use, for example, photo detection, radar, laser, ultrasonic, optical, infrared, or other suitable technology, including short range communications technologies (e.g., DSRC) or Ultra-Wide Band (UWB) radio technologies, e.g., for executing an automated vehicle operation or a vehicle navigation service. In accord with the illustrated example, the automobile 10 may be equipped with one or more digital cameras 62, one or more range sensors 64, one or more vehicle speed sensors 66, one or more vehicle dynamics sensors 68, and any requisite filtering, classification, fusion, and analysis hardware and software for processing raw sensor data. The type, placement, number, and interoperability of the distributed array of in-vehicle sensors may be adapted, singly or collectively, to a given vehicle platform for achieving a desired level of autonomous vehicle operation.

To propel the motor vehicle 10, an electrified powertrain is operable to generate and deliver tractive torque to one or more of the vehicle's drive wheels 26. The powertrain is generally represented in FIG. 1 by a rechargeable energy storage system (RESS), which may be in the nature of a chassis-mounted traction battery pack 70, that is operatively connected to an electric traction motor 78. The traction battery pack 70 is generally composed of one or more battery modules 72 each having a stack of battery cells 74, such as lithium ion, lithium polymer, or nickel metal hydride battery cells of the pouch, can, or prismatic type. One or more electric machines, such as traction motor/generator (M) units 78, draw electrical power from and, optionally, deliver electrical power to the battery pack 70. A power inverter module (PIM) 80 electrically connects the battery pack 70 to the motor/generator unit(s) 78 and modulates the transfer of electrical current therebetween. Disclosed concepts are similarly applicable to HEV and ICE-based powertrains.

The battery pack 70 may be configured such that module management, cell sensing, and module-to-module or module-to-host communication functionality is integrated directly into each battery module 72 and performed wirelessly via a wireless-enabled cell monitoring unit (CMU) 76. The CMU 76 may be a microcontroller-based, printed circuit board (PCB)-mounted sensor array. Each CMU 76 may have a GPS transceiver and RF capabilities and may be packaged on or in a battery module housing. The battery module cells 74, CMU 76, housing, coolant lines, busbars, etc., collectively define the cell module assembly.

Figure 2:
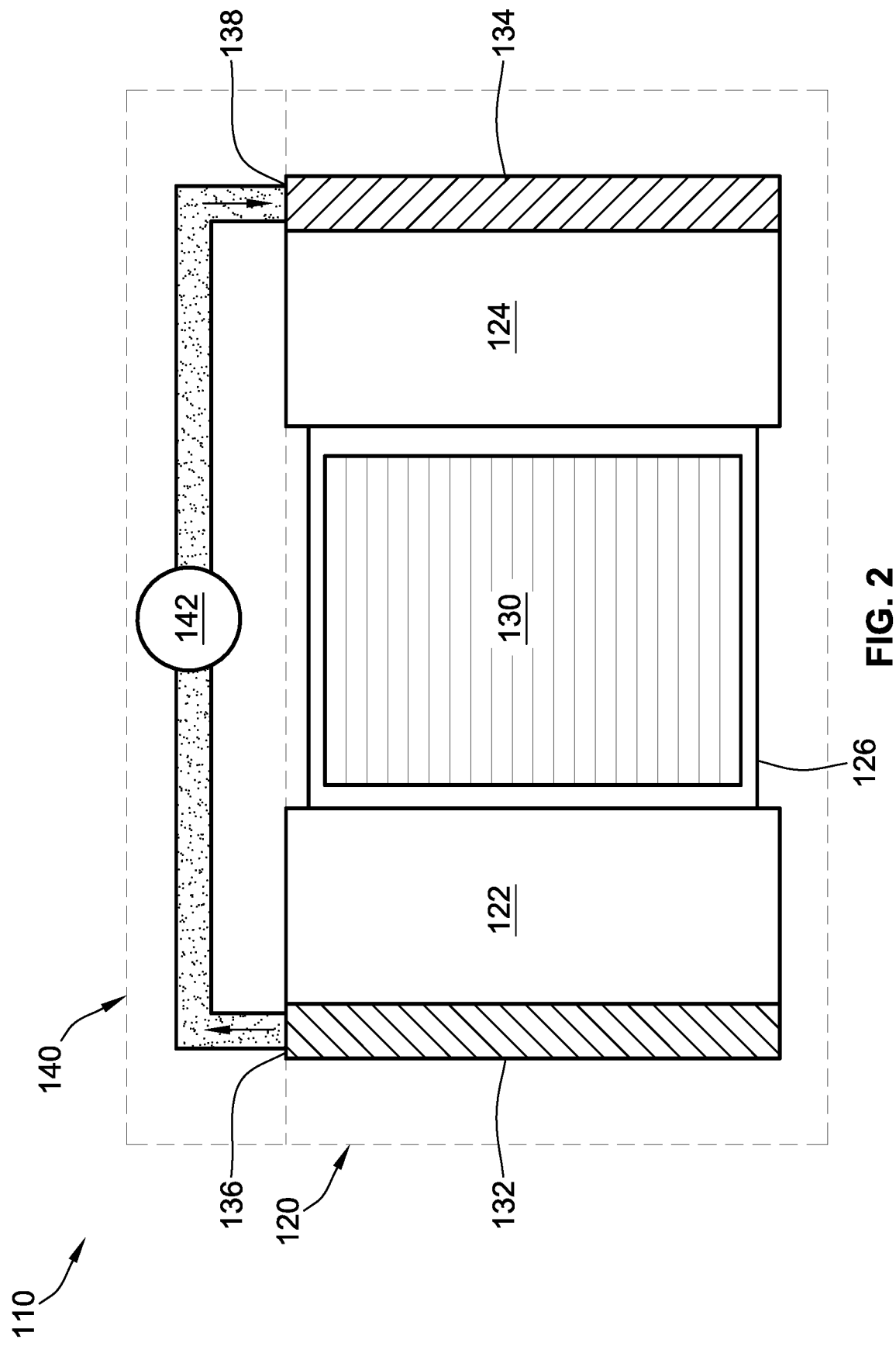
FIG. 2 is a schematic illustration of a representative electrochemical device with which aspects of the present disclosure may be practiced.

Presented in FIG. 2 is an exemplary electrochemical device in the form of a rechargeable lithium-class battery 110 that powers a desired electrical load, such as motor 78 of FIG. 1. Battery 110 includes a series of electrically conductive electrodes, namely a first (negative or anode) working electrode 122 and a second (positive or cathode) working electrode 124 that are stacked and packaged inside a protective outer housing 120. In at least some configurations, the battery housing 120 may be an envelope-like pouch that is formed of aluminum foil or other suitable sheet material. Both sides of a metallic pouch may be coated with a polymeric finish to insulate the metal from the internal cell elements and from adjacent cells. Alternatively, the battery housing (or "cell casing") 120 may take on cylindrical can constructions, i.e., for cylindrical battery cell configurations, or polyhedral box constructions, i.e., for prismatic battery cell configurations. Reference to either working electrode 122, 124 as an "anode" or "cathode" or, for that matter, as "positive" or "negative" does not limit the electrodes 122, 124 to a particular polarity as the system polarity may change depending on whether the battery 110 is being operated in a charge mode or a discharge mode. Although FIG. 2 illustrates a single battery cell unit inserted within the battery housing 120, it should be appreciated that the housing 120 may stow therein a stack of multiple cell units (e.g., five to five thousand cells or more).

Anode electrode 122 may be fabricated with an active anode electrode material that is capable of incorporating lithium ions during a battery charging operation and releasing lithium ions during a battery discharging operation. For at least some designs, the anode electrode 122 is manufactured, in whole or in part, from a lithium metal, such as lithium-aluminum (LiAl) alloy materials with an Li/Al atomic ratio in a range from 0 at. %<Li/Al<70 at. %, and/or aluminum alloys with Al atomic ratio >50 at. % (e.g., lithium metal is smelt). Additional examples of suitable active anode electrode materials include carbonaceous materials (e.g., graphite, hard carbon, soft carbon etc.), silicon, silicon-carbon blended materials (silicon-graphite composite), Li4Ti5O12, transition-metals (alloy types, e.g., Sn), metal oxide/sulfides (e.g., SnO2, FeS and the like), etc.

With continuing reference to FIG. 2, cathode electrode 124 may be fabricated with an active cathode electrode material that is capable of supplying lithium ions during a battery charging operation and incorporating lithium ions during a battery discharging operation. The cathode 124 material may include, for instance, lithium transition metal oxide, phosphate, or silicate, such as LiMO2 (M=Co, Ni, Mn, or combinations thereof); LiM2O4 (M=Mn, Ti, or combinations thereof), LiMPO4 (M=Fe, Mn, Co, or combinations thereof), and LiMxM'2-xO4 (M, M'=Mn or Ni). Additional non-limiting examples of suitable active cathode electrode materials include lithium nickel cobalt manganese oxide (NCM), lithium nickel cobalt aluminum oxide (NCA), lithium nickel cobalt manganese aluminum oxide (NCMA), and other lithium transition-metal oxides.

Figure 3:
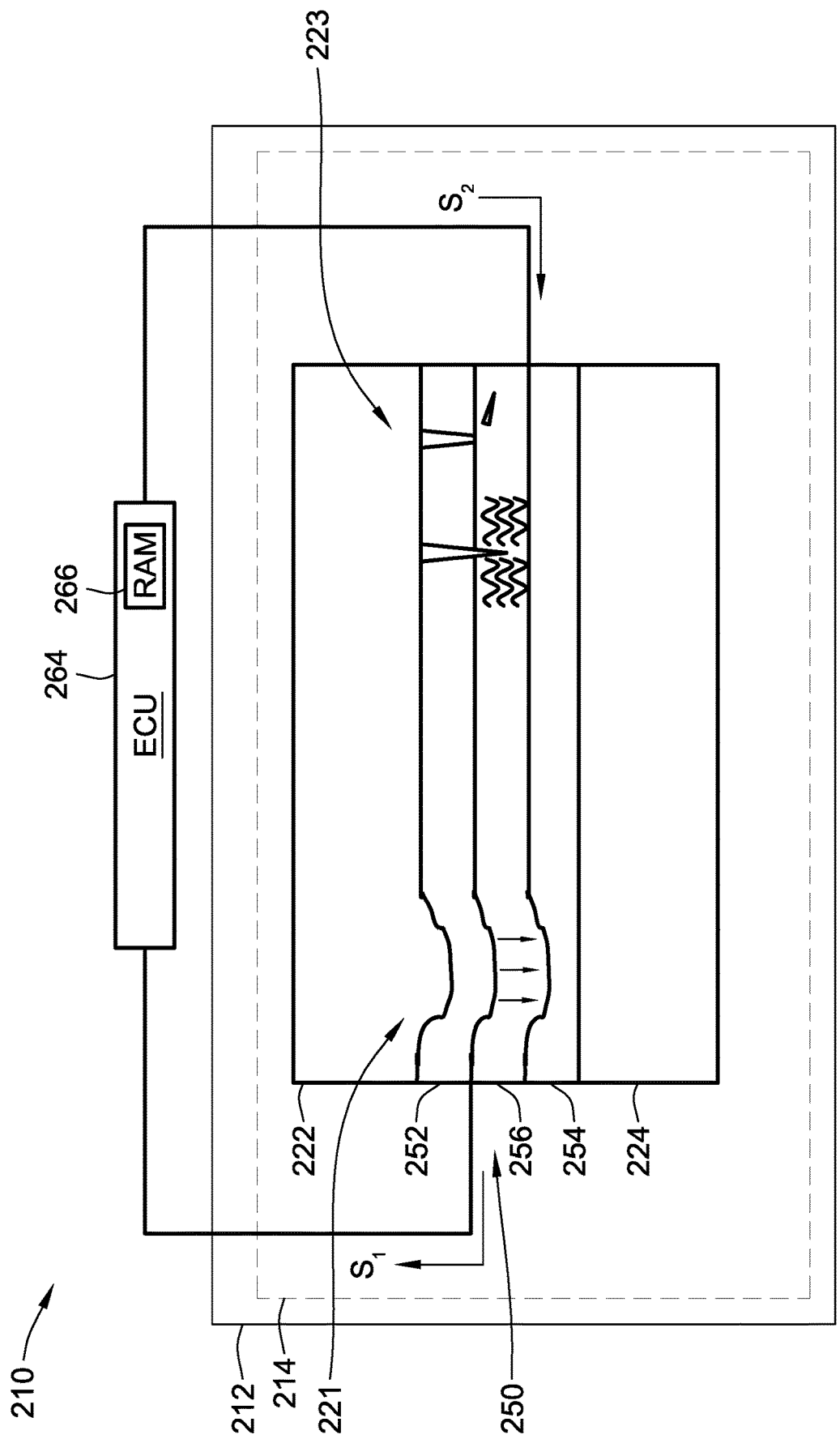
FIG. 3 is a schematic illustration of a representative battery electrode stack with a piezo-enabled electrode separator assembly sandwiched between a pair of working electrodes in accord with aspects of the disclosed concepts.

Disposed inside the battery housing 120 between each neighboring pair of electrodes 122, 124 is a porous separator 126 (FIG. 2) or an electrode separator assembly 250 (FIG. 3). The porous separator 126 may be in the nature of a microporous or nanoporous polymeric separator. Separator 126 may be a sheet-like structure that is composed of a porous polyolefin membrane, e.g., with a porosity of about 35% to about 65% and a thickness of approximately 25-30 microns. Electrically non-conductive ceramic particles (e.g., silica) may be coated onto the porous membrane surfaces of the separators 126. The porous separator 126 may incorporate a non-aqueous fluid electrolyte composition and/or solid electrolyte composition, collectively designated 130, which may also be present in the negative electrode 122 and the positive electrode 124.

A negative electrode current collector 132 may be positioned on or near the negative electrode 122, and a positive electrode current collector 134 may be positioned on or near the positive electrode 124. The negative electrode current collector 132 and positive electrode current collector 134 respectively collect and move free electrons to and from an external circuit 140. An interruptible external circuit 140 with a load 142 connects to the negative electrode 122, through its respective current collector 132 and electrode tab 136, and to the positive electrode 124, through its respective current collector 134 and electrode tab 138.

The porous separator 126 may operate as both an electrical insulator and a mechanical support structure by being sandwiched between the two electrodes 122, 124 to prevent the electrodes from physically contacting each other and, thus, the occurrence of a short circuit. In addition to providing a physical barrier between the electrodes 122, 124, the separator 126 may provide a minimal resistance path for internal passage of lithium ions (and related anions) during cycling of the lithium ions to facilitate functioning of the battery 110. For some configurations, the porous separator 126 may be a microporous polymeric separator including a polyolefin. The polyolefin may be a homopolymer, which is derived from a single monomer constituent, or a heteropolymer, which is derived from more than one monomer constituent, and may be either linear or branched. In a solid-state battery, the role of the separator may be partially/fully provided by a solid electrolyte layer.

Operating as a rechargeable energy storage system, battery 110 generates electric current that is transmitted to one or more loads 142 operatively connected to the external circuit 140. While the load 142 may be any number of electric devices, a few non-limiting examples of power-consuming load devices include electric motors for hybrid and full-electric vehicles, laptop and tablet computers, cellular smartphones, cordless power tools and appliances, portable power stations, etc. The battery 110 may include a variety of other components that, while not depicted herein for simplicity and brevity, are nonetheless readily available. For instance, the battery 110 may include one or more gaskets, terminal caps, tabs, battery terminals, cooling hardware, charging hardware, and other commercially available components or materials that may be situated on or in the battery 110. Moreover, the size and shape and operating characteristics of the battery 110 may vary depending on the particular application for which it is designed.

In addition to the optional components identified in the preceding paragraph, the battery 110 of FIG. 2 may also include one or more functional electrode separators with a piezoelectric layer that provisions in-stack pressure sensing and in situ dendrite cleaning. Presented in FIG. 3, for example, is a portion of a representative electrochemical device 210 with an internal electrode separator assembly 250 that enables real-time pressure sensing capabilities and selective fracturing of lithium dendrite growth. The in-stack electrode separator assembly 250 deforms with adjoining (first and second) working electrodes 222 and 224 to sense pressure changes that are caused, for example, by electrode swelling, solid electrolyte interface (SEI) growth, localized dendrite growth, etc. Electrode deformation and any attendant pressure changes effect a shifting of the internal crystalline structure of the piezoelectric "smart" material; this mechanical stress causes the piezo material to generate an electrical potential with a corresponding release of an electrical charge. By monitoring the resultant electrical signal output from the piezo material, a corresponding voltage may be measured and, from this voltage and a predefined correlation between the piezo material's voltage and deformation (e.g., a linear correlation, a fitted linear correlation, a calibrated look-up table, etc.), a real-time or near real-time in-stack pressure value may be derived from the associated deformation.

Along with providing in-stack pressure sensing capabilities, the piezo material of the electrode separator assembly 250 may be driven by an alternating current/voltage input to selectively generate a localized mechanical vibration that breaks electrode-borne dendrite growth. Incorporating a ceramic piezoelectric layer into an electrode stack between neighboring electrodes may also help to improve the thermal and mechanical stability of the polymer separators. As yet a further option, electrode surface roughness may be measured using a discrete-region connection arrangement or a mesh-pattern connection arrangement for the piezoelectric layer. For instance, the piezoelectric layer and its adjoining conductive layers may be located in a predefined pattern at one or more select regions on the surface of an electrode. If multiple regions are monitored on a given electrode, each region may employ a respective conductive region and/or connection wire. In this way, an independent electrical signal may be collected from the select location(s) for improved accuracy and increased signal-to-noise ratio. If there is specific interest in how an electrode swells at or near its tab due to high operating temperatures, for example, a piezoelectric layer/coating may be located close to the electrode tab. Optionally, a mesh-patterned array of connectors may be employed to collect a signal matrix of pressure change in order to calculate surface roughness. An individual connection wire may be employed for each matrix point.

Figure 4:
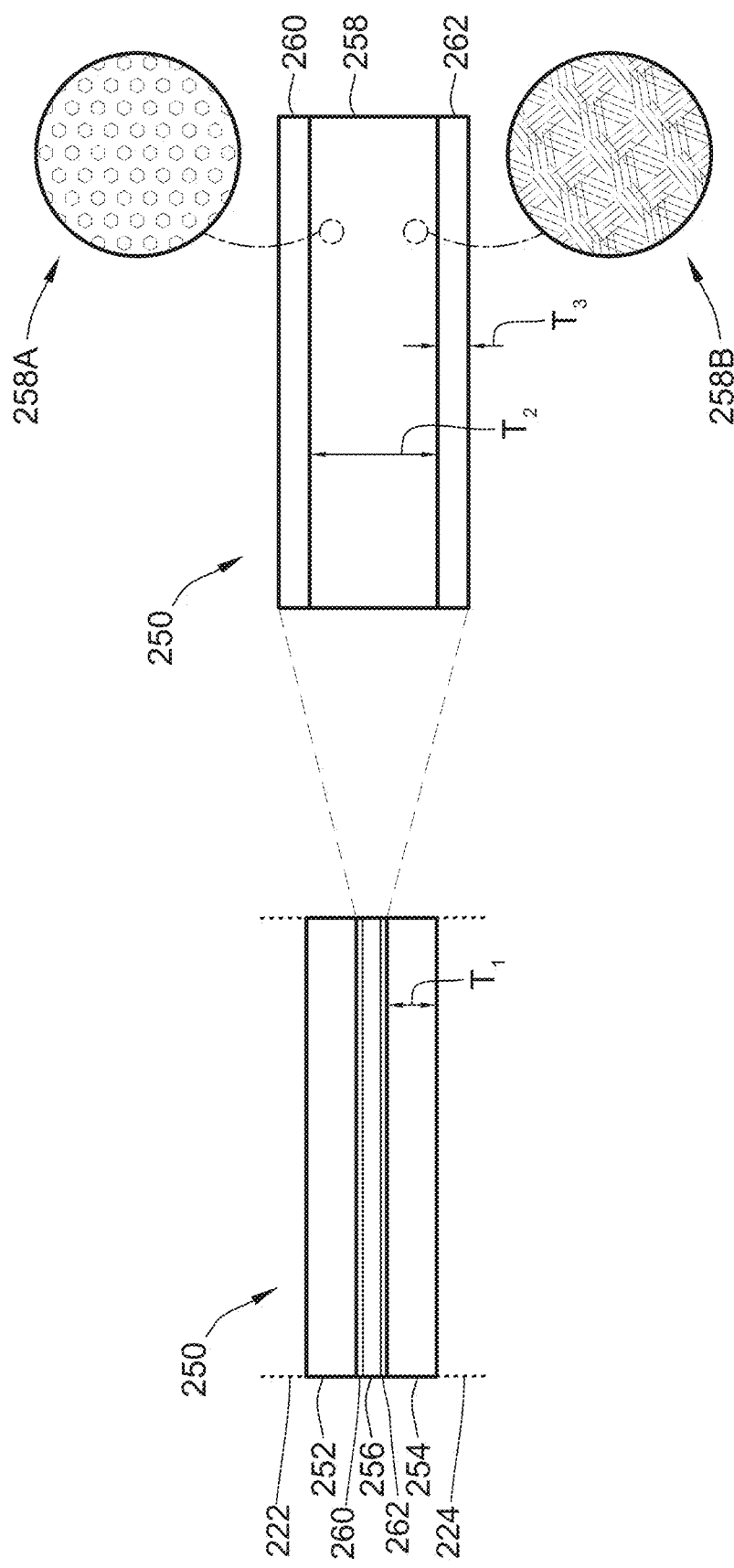
FIG. 4 is a schematic illustration of the representative piezo-enabled electrode separator assembly of FIG. 3.

Similar to the electrochemical device presented in FIG. 2, the electrochemical device 210 of FIGS. 3 and 4 may be configured as a rechargeable lithium-class battery that powers a desired electrical load, such as motor 78 of FIG. 1. Although differing in appearance, it is envisioned that any of the features and options described above with reference to the battery pack 70 of FIG. 1 and the lithium-class battery 110 of FIG. 2 can be incorporated, singly or in any combination, into the electrochemical device 210 of FIG. 3, and vice versa. Some representative points of similarity include a protective and fluid-tight device housing 212 (also referred to as "battery housing") that contains therein an electrolyte 214, which is chemically configured to conduct ions. Also packaged inside the device housing 212, in electrochemical contact with the electrolyte 214, is an electrode stack composed of one or more (first) working electrodes 222 interleaved with and juxtaposed in face-to-face relation to one or more (second) working electrodes 224. While portrayed with a single pair of working electrodes, the electrochemical device 210 may include multiple electrode pairs (e.g., 10-20 or more) that are stacked and connected in parallel or series for storing and supplying electrical energy.

Inserted between the two neighboring electrodes 222, 224 is an electrode separator assembly 250 that is likewise disposed inside the device housing 212 in electrochemical contact with the electrolyte 214. For device configurations incorporating multiple mated pairs of opposite-polarity electrodes, a respective electrode separator assembly 250 may be sandwiched between one, some, or all electrode pairs. In accord with the illustrated example, the electrode separator assembly 250 is a multilayer sandwich structure with five distinct sections: (1) an upper (first) separator layer 252; (2) a lower (second) separator layer 254; and (3) a central functional layer 256, which includes (a) a central piezoelectric layer 258; (b) an upper (first) conductive layer 260; and (c) a lower (second) conductive layer 262. For at least some device architectures, the electrode separator assembly 250 consists essentially of the two electrically insulating separator layers 252, 254, the two electrically transmissive conductive layers 260, 262, and the pressure-sensitive piezoelectric layer 258. It is also within the scope of this disclosure that the electrode separator assembly 250 incorporate additional or alternative layers, including those that do and those that do not materially change the functionality of the assembly.

The two separator layers 252, 254 are portrayed in FIG. 4 as the outermost layers of the electrode separator assembly 250, generally coterminous with and encasing therebetween the functional layer 256. With this arrangement, the first separator layer 252 is sandwiched between and directly physically contacts both the first working electrode 222 and the first conductive layer 260, whereas the second separator layer 254 is sandwiched between and directly physically contacts both the second working electrode 224 and the second conductive layer 262. In this regard, the piezoelectric layer 258 is portrayed as the central-most layer of the electrode separator assembly 250, directly physically contacting inward-facing surfaces of the two conductive layers 260, 262. As used herein, the term "layer" is inclusive of but does not per se require that a particular segment of the composite construction be a continuous sheet or otherwise span the entirety of all remaining layers.

Similar to the separator 126 of FIG. 2, the separator layers 252, 254 of FIGS. 3 and 4 are electrically insulative, in that they prevent short-circuiting contact between the two electrodes 222, 224, yet are ionically transmissive, in that they allow for the back-and-forth transfer of ions between the two working electrodes 222, 224. In this vein, the separator layers 252, 254 may include any of the options and alternatives described above with reference to the separator 126. For instance, each separator layer 252, 254 may be fabricated, in whole or in part, from an electrically insulating material, such as polypropylene (PP), polyethylene (PE), polyvinylidene fluoride (PVDF) nanofiber web, polytetrafluoroethylene (PTFE) based separator, polytriphenylamine (PTPAn) modified separator, cellulose-based composite separator, or other functionally suitable polymeric material. Each separator layer 252, 254 may have a substantially uniform thickness $T_1$ of about 5 μm to about 30 μm.

Interposed between the two separator layers 252, 254 and the two conductive layers 260, 262 is an electromechanical piezoelectric layer 258 that employs a pressure-sensitive "smart" material that reversibly exhibits the piezoelectric effect. In particular, the piezoelectric layer 258: (1) outputs an electrical output signal responsive to compression, bending, or other deformation of the piezoelectric layer 258; and (2) deforms responsive to receipt of an electrical activation signal. Non-limiting examples of piezoelectric materials that may be incorporated into the piezoelectric layer 258 include lead zirconium titanate (PZT), zinc oxide (ZnO), polyvinylidene difluoride (PVDF), composite piezo materials, etc. By way of non-limiting example, a porous ZnO thin film coating with an internal lattice structure is shown generally at 258A in an inset view of FIG. 4. As another option, a porous nano-filled PVDF copolymer film formed via electrospinning is shown generally at 258B in another inset view of FIG. 4. The piezoelectric layer 258 may be manufactured using any commercially suitable method, including spin coating, sol-gel coating, etc. As yet a further option, the piezoelectric layer may have a substantially uniform thickness $T_2$ of about 0.5 µm to about 10 µm.

In order to transmit electrical signals to and from the functional layer 256 of the electrode separator assembly 250, a pair of conductive layers 260, 262 sandwich therebetween and abut the piezoelectric layer 258. Each conductive layer 260, 262 is fabricated, in whole or in part, from an electrical conductor that allows for the bidirectional flow of electricity with minimal resistance. Some non-limiting examples of conductive materials include, but are certainly not limited to, aluminum (Al), silver (Ag), copper (C), gold (Au), steel (e.g., type 304 and type 316 stainless steel), etc. In at least some embodiments, the conductive layers 260, 262 may be applied onto opposing major faces of the piezoelectric layer 258 by sputter coating. In addition, each conductive layer 260, 262 may have a substantially uniform thickness $T_3$ of about 10 nm to about 500 nm.

All five layers of the electrode separator assembly 250 are sufficiently porous and permeable to transmit therethrough the ions of the electrolyte 214. For instance, the separator layers 252, 254 may have a first porosity and the functional layer 256, including the piezoelectric layer 258 and the conductive layers 260, 262, has a second porosity. Depending on the piezoelectric material selected for the functional layer 256, for example, the porosity of the separator layers 252, 254 may be substantially identical to or, alternatively, measurably distinct from the porosity of the piezoelectric layer 258. By way of example, and not limitation, the porosities of the electrode separator assembly 250 layers have a void fraction (i.e., void volume to total volume) of about 30% to about 80% or, in at least some applications, a porosity of about 45% to about 70%.

Operation of the electrode separator assembly 250 may be automated through a resident or remote electronic controller, processing unit, logic circuit, or other module or device or network of modules/devices, such as CPU 36 of FIG. 1 and/or electronic control unit (ECU) 264 of FIG. 3. The ECU 264 of FIG. 3, for example, is electrically connected to the piezoelectric layer 258 via feed-through electrical leads and conductive layers 260, 262 for receiving one or more electrical (output) signals $S_1$ generated by the piezoelectric layer 258, and for transmitting one or more electrical (activation) signals $S_2$ to the piezoelectric layer 258. The ECU 264 may be programmed to execute memory-stored, processor-executable logic maintained in a resident or remote memory device, such as RAM 266 of FIG. 3, to actively sense pressure changes in the electrode stack and to selectively clean dendrite formation from one or more electrodes.

The electrode separator assembly 250, through cooperative operation with the ECU 264, provisions in-stack pressure sensing for the electrochemical device 210. During a battery discharge operation, for example, ECU 264 may receive an electrical output signal $S_1$ from the piezoelectric layer 258 that is generated in response to deformation of the piezo material via thermal expansion/bending (shown schematically at 221) of one or both electrodes 222, 224. ECU 264 thereafter measures the signal voltage for the electrical output signal $S_1$, e.g., using a dedicated voltage meter or an encoded software module. A stack pressure of the electrode stack is then determined by regressing the signal voltage using a calibrated correlation between voltage and deformation of the piezoelectric material in functional layer 256. In particular, each type of piezoelectric material exhibits a quantifiable correlation between voltage change and deformation. This correlation may be calibrated for the piezoelectric material selected for the functional layer 256 and, optionally, collected in a memory-stored look-up table. Each deformation value is assigned a predefined stack pressure value; these stack pressure values may be incorporated into the memory-stored look-up table for later retrieval during signal analysis. Upon receipt of an electrical signal $S_1$ output from the piezoelectric layer 258, a regression is performed from the calibrated voltage-to-deformation correlation to derive a deformation corresponding to the signal voltage of the signal $S_1$ ($Y_{def}$=regress($X_{vol}$)). The stack pressure value corresponding to the derived deformation may be derived by regressing the deformation to pressure.

The electrode separator assembly 250, through cooperative operation with the ECU 264, may also provision in situ dendrite cleaning for the electrochemical device 210. For example, ECU 264 may selectively transmit an electrical activation signal $S_2$ to the functional layer 256 that causes the piezoelectric layer 258 to generate a localized mechanical vibration (shown schematically at 223). The activation signal $S_2$ may be modulated with a predetermined amplitude and/or frequency sufficient to break and/or remove dendrite formation from one or both working electrodes 222, 224. In accord with the illustrated example, the signal amplitude may maintain a voltage of about 12V or less to actuate the piezoelectric layer 258 without delaminating the assembly 250. As yet a further option, the signal frequency may be tuned to match the piezoelectric material's natural frequency; a desired frequency range may be from about 1 kHz to about 1 MHz.

Aspects of the present disclosure have been described in detail with reference to the illustrated embodiments; those skilled in the art will recognize, however, that many modifications may be made thereto without departing from the scope of the present disclosure. The present disclosure is not limited to the precise construction and compositions disclosed herein; any and all modifications, changes, and variations apparent from the foregoing descriptions are within the scope of the disclosure as defined by the appended claims. Moreover, the present concepts expressly include any and all combinations and subcombinations of the preceding elements and features.

What is claimed:

1. An electrochemical device, comprising:
a device housing;
an electrolyte located inside the device housing and configured to conduct ions;
an electrode stack located inside the device housing and including first and second working electrodes in electrochemical contact with the electrolyte;
an electrode separator assembly located inside the device housing and interposed between the first and second working electrodes, the electrode separator assembly including:
first and second separator layers including an electrically insulating material and configured to transmit therethrough the ions of the electrolyte; and
a piezoelectric layer interposed between the first and second separator layers, the piezoelectric layer configured to output an electrical output signal in response to deformation of the piezoelectric layer and to deform in response to receipt of an electrical activation signal; and
an electronic controller operatively connected to the electrode separator assembly and programmed to transmit the electrical activation signal to the piezoelectric layer to generate a mechanical vibration with a predetermined amplitude and/or frequency sufficient to break and/or remove dendrite formation from the first and/or second working electrodes.

2. The electrochemical device of claim 1, wherein the first and second separator layers have a first porosity and the piezoelectric layer has a second porosity.

3. The electrochemical device of claim 2, wherein the first porosity of the first and second separator layers is different from the second porosity of the piezoelectric layer.

4. The electrochemical device of claim 2, wherein the first and second porosities have a void fraction of about 30% to about 80%.

5. The electrochemical device of claim 1, wherein the electrically insulating material of the first and second separator layers includes polypropylene, polyethylene, polyvinylidene fluoride, polytetrafluoroethylene, polytriphenylamine, and/or cellulose composite.

6. The electrochemical device of claim 1, wherein the first and second separator layers each has a thickness of about 5 micrometers (µm) to about 30 µm.

7. The electrochemical device of claim 1, wherein the piezoelectric layer has a thickness of about 0.5 micrometers (µm) to about 10 µm.

8. The electrochemical device of claim 1, wherein the piezoelectric layer includes lead zirconium titanate, zinc oxide, polyvinylidene difluoride, piezo ceramic, and/or piezo polymer.

9. The electrochemical device of claim 1, wherein the electrode separator assembly further includes first and second conductive layers sandwiching therebetween the piezoelectric layer and configured to conduct electricity to and from the piezoelectric layer.

10. The electrochemical device of claim 9, wherein the first and second conductive layers each has a thickness of about 10 nanometers (nm) to about 500 nm and includes copper, aluminum, silver, nickel, graphene, and/or gold.

11. The electrochemical device of claim 9, wherein the electrode separator assembly consists essentially of the first and second electrically insulating separator layers, the first and second conductive layers, and the piezoelectric layer.

12. The electrochemical device of claim 9, wherein the first separator layer is sandwiched between and abuts the first working electrode and the first conductive layer, the second separator layer is sandwiched between and abuts the second working electrode and the second conductive layer, and the piezoelectric layer abuts both the first and second conductive layers.

13. The electrochemical device of claim 1, wherein the electronic controller is further programmed to:
receive the electrical output signal from the piezoelectric layer generated in response to deformation of the first and/or second working electrodes;
determine a signal voltage of the electrical output signal; and
determine a stack pressure of the electrode stack by regressing the signal voltage using a calibrated correlation between voltage and deformation of the piezoelectric layer.

14. A method of assembling an electrochemical device, the method comprising:
receiving a device housing of the electrochemical device;
locating an electrolyte inside the device housing, the electrolyte being configured to conduct ions;
locating an electrode stack inside the device housing in electrochemical contact with the electrolyte, the electrode stack including first and second working electrodes;
locating an electrode separator assembly inside the device housing and between the first and second working electrodes, the electrode separator assembly including:
first and second separator layers including an electrically insulating material and configured to transmit therethrough the ions of the electrolyte; and
a piezoelectric layer interposed between the first and second separator layers, the piezoelectric layer configured to output an electrical output signal in response to deformation of the piezoelectric layer and to deform in response to receipt of an electrical activation signal; and
connecting the electrode separator assembly to an electronic controller programmed to transmit the electrical activation signal to the piezoelectric layer to generate a mechanical vibration with a predetermined amplitude and/or frequency sufficient to break and/or remove dendrite formation from the first and/or second working electrodes.

15. The method of claim 14, wherein the first and second separator layers have a first porosity and the piezoelectric layer has a second porosity.

16. The method of claim 14, wherein the first and second separator layers each has a thickness of about 5 micrometers (µm) to about 30 µm, and wherein the electrically insulating material of the first and second separator layers include polypropylene and/or polyethylene.

17. The method of claim 14, wherein the piezoelectric layer has a thickness of about 0.5 micrometers (µm) to about 10 µm, and wherein the piezoelectric layer includes lead zirconium titanate, zinc oxide, and/or polyvinylidene difluoride.

18. The method of claim 14, wherein the electrode separator assembly further includes first and second conductive layers sandwiching therebetween the piezoelectric layer and configured to conduct electricity to and from the piezoelectric layer.

* * * * *